United States Patent [19]

Durst

[11] Patent Number: 5,061,865
[45] Date of Patent: Oct. 29, 1991

[54] NON-LINEAR TRANSIMPEDANCE AMPLIFIER

[75] Inventor: David I. Durst, Syosset, N.Y.

[73] Assignee: Grumman Aerospace Corporation, Bethpage, N.Y.

[21] Appl. No.: 556,539

[22] Filed: Jul. 23, 1990

[51] Int. Cl.[5] ............................................. G06G 7/12
[52] U.S. Cl. .................................. 307/490; 328/127; 328/151; 307/494
[58] Field of Search ............... 307/353, 356, 362, 491, 307/494, 490; 328/127, 128

[56] References Cited

U.S. PATENT DOCUMENTS

| | | | |
|---|---|---|---|
| 3,665,196 | 5/1972 | Macall | 250/83.3 H |
| 3,787,668 | 1/1974 | Currie et al. | 235/152 |
| 3,970,875 | 7/1976 | Leehan | 307/304 |
| 3,975,648 | 8/1976 | Tobey et al. | 307/297 |
| 4,004,148 | 1/1977 | Howard et al. | 205/370 |
| 4,007,415 | 2/1977 | Toyoda | 323/19 |
| 4,045,675 | 8/1977 | Kingley et al. | 250/370 |
| 4,054,797 | 10/1977 | Milton et al. | 250/332 |
| 4,064,448 | 12/1977 | Eatock | 323/22 |
| 4,115,692 | 9/1978 | Balcerack et al. | 250/338 |
| 4,279,691 | 12/1979 | Keller | 340/567 |
| 4,978,872 | 12/1990 | Morse et al. | 307/353 |

OTHER PUBLICATIONS

Infrared Detectors "Detectivity and Preamplifier Consideration from Indium Antimonide Photovoltaic Detectors", G. R. Pruett and R. L. Petrits, Hallsted Press (1959), pp. 1524-1529.
Electronics, 2/3/77, pp. 96-100.

Primary Examiner—Stanley D. Miller
Assistant Examiner—Sinh N. Tran
Attorney, Agent, or Firm—Stetina and Brunda

[57] ABSTRACT

A non-linear transimpedance amplifier utilizing a reset integrator and having a broad dyamic range for amplifying an input signal over an extended range of levels is disclosed. The non-linear transimpedance amplifier comprises an accumulator for accumulating a charge representative of the input signal, a comparator for comparing the output of the first circuit to a reference voltage, a sample and hold for providing a voltage representative of the level of a time varying waveform at the instant during which the accumulator saturates, and a summer for summing a signal representative of the accumulated charge and the signal representative of the level of the time varying waveform. The output signal is representative of the input signal when the accumulator is unsaturated as well as when the accumulator is saturated. The present invention may also be operated as a linear amplifier. It finds particular application in the input circuits of infrared detector elements.

23 Claims, 3 Drawing Sheets

TYPICAL NON-LINEAR TIA IMPLEMENTATION

TYPICAL NON-LINEAR TIA IMPLEMENTATION

NON-LINEAR TRANSIMPEDANCE AMPLIFIER

FIELD OF THE INVENTION

The present invention relates generally to an electronic amplifier circuit and more particularly to a non-line-ar transimpedance amplifier utilizing a reset integrator and having a broad dynamic range for amplifying an input signal over an extended range of levels and for providing an output representative of the input signal whether or not the reset integrator has saturated.

BACKGROUND OF THE INVENTION

Amplifying circuits for conditioning low level signals are well known. One type of such an amplifying circuit is commonly referred to as a reset integrator circuit. The reset integrator circuit comprises an amplifier, a capacitor, and a switch for discharging or resetting the capacitor. The input signal, e.g. the current output of the infrared detector element, is amplified and used to accumulate a charge upon the capacitor. The process of accumulating a charge is known as integration. The switch is used to reset the capacitor prior to each integration cycle.

The charge accumulated upon the capacitor provides a voltage which is representative of the detector output over the integration cycle. The voltage is typically transferred to a sample and hold circuit from which it is multiplexed to signal processing circuitry.

Although reset integrator circuits function adequately as input circuits for many applications, certain limitations arise with respect to power consumption requirements for amplifying signals of various amplitudes including very low level amplitudes. In order to satisfy such dynamic range requirements the reset integrator circuit is penalized in the form of power consumption requirements and capacitor requirements. The present invention is directed to a circuit and technique for obtaining the advantages of the reset integrator circuit without the associated disadvantages discussed above.

The output of the reset integrator circuit is responsive to the voltage across the capacitor. If the capacitor becomes fully charged it can no longer respond to an additional input signal. That condition, known as capacitor saturation, can be avoided by utilizing a larger capacitor. However, the cost penalties related to utilizing such a capacitor in integrated circuit surface area, component expense, and power consumption are undesirable, particularly where the input circuit is intended to operate on low level signals. The present invention addresses these deficiencies by providing the technique for expanding the effective dynamic range of the reset integrator circuit beyond the limitations of the capacitor. Thus, greater dynamic range is achieved without the attendant penalties relating to component costs and power consumption. Prior to the present invention several alternate approaches to the problem of capacitor saturation have been considered. One such approach incorporates a non-linear amplifier stage in series with the reset integrator. The non-linear amplifier stage provides constantly diminishing output to the capacitor for each increment of input signal, thus preventing saturation of the capacitor. Though this technique adequately avoids the need to replace the capacitor, it does not adequately address the issue of power consumption. Moreover, this technique results in a lack of gain uniformity from channel to channel (due to the lack uniformity inherent in non-linear amplifiers) and results in offset drift.

A second alternative technique for addressing deficiencies inherent in the reset integrator circuit involves fabricating a non-linear integration capacitor. The capacitance of the non-linear integration capacitor would increase with proportion to the amount of charge stored upon the capacitor. Unfortunately such non-linear integration capacitors are difficult and expensive to fabricate.

A third alternative is to fabricate a piece-wise, linear approximation to a non-linear capacitor by providing one or more additional capacitors across the primary integration capacitor during the integration interval. The additional capacitors are selectively connected to the input at predetermined voltage thresholds and serve to accommodate signal levels in excess of that which would saturate the primary integration capacitor. The additional capacitors are typically comparable in size to the primary integration capacitor and would consume the same amount of surface area on an integrated circuit wafer. Moreover, the switching action resulting in the injection of additional capacitors to the input circuit results in distortion of the input signal.

Accordingly, it is desirable to provide a reset integrator circuit that operates at low signal levels, has a wide dynamic range of response, and does not result in excessive power consumption, the need for expensive components, or result in the injection of errors due to the sequential introduction of additional capacitors. These and other objects and advantages are addressed by the present invention, which is described below in connection with the preferred embodiment illustrated in the drawings.

SUMMARY OF THE INVENTION

The present invention is an amplifying circuit for conditioning low level signals having a broad dynamic range and for providing a non-linear output representative of the low level input signals. The non-linear transimpedance amplifier comprises a reset integrator for accumulating a charge representative of the input signal, a saturation sensing circuit for generating a signal representative of the input signal in excess of that required to saturate the reset integrator, and a compensation circuit for applying the output of the saturation sensing circuit to the output of the reset integrator.

A signal generator generates a time varying waveform and a comparator compares the voltage across a capacitor in the reset integrator to a reference voltage to determine when the capacitor has reached saturation, a sample and hold in the saturation sensing circuit generates a signal representative of the level of the time varying- waveform at the instant during which the capacitor saturates, and a summer sums a signal representative of the capacitor output and the signal representative of the contemporaneous level of the time varying waveform. The output of the non-linear transimpedance amplifier is representative of the input signal as measured by the capacitor as well as the additional input beyond the capacitor saturation level.

The present invention finds particular application in the input circuits of infrared detector elements. Such circuits commonly utilize a reset integrator and are therefore subject to saturation and the consequent distortion of the output signal.

The transimpedance amplifier of the present invention comprises a reset integrator for receiving the input signal and for accumulating a charge representative of the input signal. The reset integrator generates an output signal representative of the charge accumulated. When the amplitude of the input signal is sufficiently low that the accumulator does not become saturated during the integration interval, then the output of the reset integrator is representative of the input. The output of the non-linear transimpedance amplifier is substantially linear for such lower level input signals.

A saturation sensing circuit provides a means for maintaining the output signal of the transimpedance amplifier as representative of the input signal even though the reset integrator becomes saturated due to a larger input signal. The saturation sensing circuit senses the time at which the reset integrator becomes saturated in relation to an input signal. This time is inversely proportional to the level of the input signal. The larger the input signal, the sooner the reset integrator becomes saturated. The saturation sensing circuit generates an output having a level which is inversely proportional to the time required for the reset integrator to reach saturation. The shorter the time for the reset integrator to reach saturation, the larger the generated output of the saturation sensing circuit. If the reset integrator does not saturate then no signal is generated by the saturation sensing circuit. The output of the saturation sensing circuit is applied to the output of the reset integrator by a summer. This results in an output signal representative of the input signal, even where the input signal exceeds the reset integrator saturation level.

The sooner the reset integrator becomes saturated, the greater the input signal that is not captured by the reset integrator and the larger the output generated by the saturation sensing circuit to supplement the output of the reset integrator. The output of the non-linear transimpedance amplifier is non-linear for such higher level input signals. Each incremental increase in input level results in a decreasing incremental increase in output level.

The present invention may be embodied as a linear amplifier by providing a suitable waveform to the saturation sensing circuit. Alternatively, the saturation sensing circuit could provide a signal which increases at linear rate with time after the charge integrator saturates, without the need for an externally generated waveform.

These, as well as other advantages of the present invention will be more apparent from the following description and drawings. It is understood that changes in the specific structure shown and described may be made within the scope of the claims Without departing from the spirit of the invention.

DETAILED DESCRIPTION OF THE PREFERRED EMBODIMENT

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiment. It is to be understood, however, that the same or equivalent functions and sequences may be accomplished by different embodiments that are also intended to be encompassed within the spirit and scope of the invention. The nonlinear transimpedance amplifier of the present invention is illustrated in FIGS. 1-5 which depict a presently preferred embodiment of the invention and graphical representations of its operating characteristics. A transimpedance amplifier is a circuit which converts a low level input current to a high level output voltage. Such circuits are useful in the detection of photodetector output signals. A reset integrator is a common form of transimpedance amplifier and has the advantage of inherent low pass filtering.

In a reset integrator the low level input current is accumulated as a charge upon a capacitor. The voltage across the capacitor at the end of a fixed time T is provided by the time integral of the current divided by the capacitance of the reset integrator as shown in Equation 1.

$$V(t = T) = (1/C) * \int_0^T i(t)dt \qquad \text{EQUATION 1}$$

The time interval T is referred to as the integration interval. The integration interval is selected to be sufficiently short that to a first approximation, the input signal i(t) can be considered to be constant. Making this assumption i(t) in Equation 1 can be replaced by I (the average of i(t) during the interval T) and can therefore be taken outside of the integral as shown in Equation 2.

$$V(t = T) = (T/C) * I \qquad \text{EQUATION 2}$$

The transfer function of the reset integrator over the interval T is given by the ratio of the reset integrator's output voltage V to its input current I. The term V/I is referred to as the transimpedance gain (Zt) of the circuit. The transimpedance gain is given by T/C where T is the integration interval in seconds and C is the capacitance in Farads. The gain Zt of the transimpedance amplifier represents the conversion of the time average input current i(t) over the interval T resulting in the output V.

The output voltage V is sampled at the end of the integration interval. Due to the inherent limitations of any real capacitor a saturation point can be reached after which any further current input does not result in an increase in output voltage.

Figure 1:
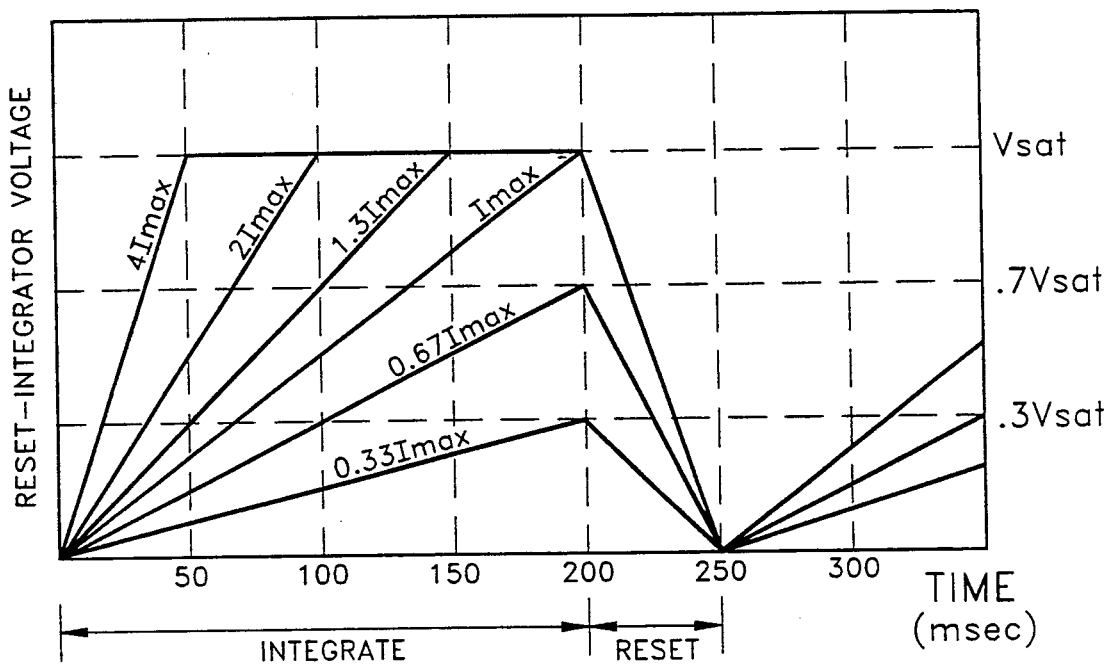
FIG. 1 is a graph depicting reset integrator voltage versus time for various input current levels.

Referring now to FIG. 1 the reset integrator output voltage for various input currents is depicted. Imax is the maximum amount of current that can be received during the integration interval without saturating the reset integrator. For example, an input current of 0.33 Imax results in an output voltage of 0.3 Vsat at the end of the integration interval of 200 msec. Therefore, the input current of 0.33 Imax does not result in saturation of the reset integrator. An input current of Imax results in the output voltage just reaching Vsat at the end of the 200 msec integration interval. An input current of Imax therefore likewise does not result in distortion of the output signal due to saturation.

An input current of 2 Imax results in reaching an output voltage of Vsat within 100 msec, one-half way through the 200 msec integration interval. Therefore, an input current of 2 Imax results in saturation of the reset integrator at 100 msec. Current received by the reset integrator after 100 msec does not cause any further increase in the output voltage of the saturated reset integrator. Therefore, the output voltage of the reset integrator does not accurately reflect the input current received during the integration interval.

Any input current in excess of Imax results in saturation of the reset integrator and an output voltage which is not accurately representative of the input current. The maximum input current for which an accurate output voltage is obtained is equal to Imax=Vsat/Zt. For currents less than Imax the reset integrator provides a linear amplification function. For input higher than Imax the output of a reset integrator will never exceed Vsat, i.e. the signal will be clipped at this level. The present invention effectively eliminates this problem by providing a saturation sensing circuit which senses the time at which the reset integrator saturates and then generates an output which is inversely proportional to the time at which the reset integrator saturated. Thus, the signal generated by the saturation sensing circuit is greater in level when the input current is higher and the reset integrator saturates at an earlier time during the integration interval. The generated signal is added to the output of the reset integrator to provide a nonlinear output signal which is representative of the current input to the reset integrator. A relatively constant input signal is assumed over the integrating interval. The integration interval is chosen such that the input signal remains substantially constant over the integration interval.

Figure 2:
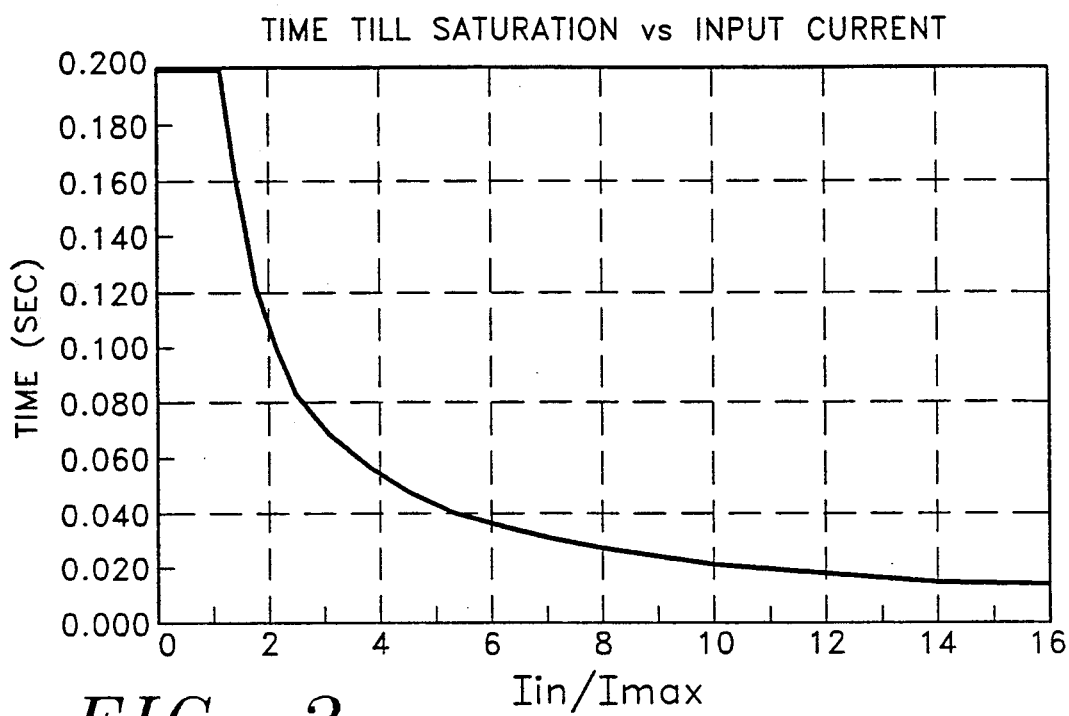
FIG. 2 is a graph depicting the time required for the reset integrator to saturate versus the level of the input current.

Referring now to FIG. 2, the time required for the reset integrator to reach saturation for various input currents Imax is depicted. For an input current equal to Imax (Iin/Imax=1) the reset integrator does not saturate until 200 msec which is precisely the end of the reset interval. For an input current of 2 Imax (Iin/Imax=2) the reset integrator saturates at the end of 100 msec.

Use of the non-linear transimpedance amplifier results in an increase in dynamic range, permitting the input of signals over an extended range of levels. While this results in a loss of resolution for the higher level signals, the accuracy of the measurement required for higher level signals is typically much lower than that required for lower level signals. Thus, accuracy is maintained where needed and sacrificed where less important to provide for an increase in dynamic range.

Figure 3:
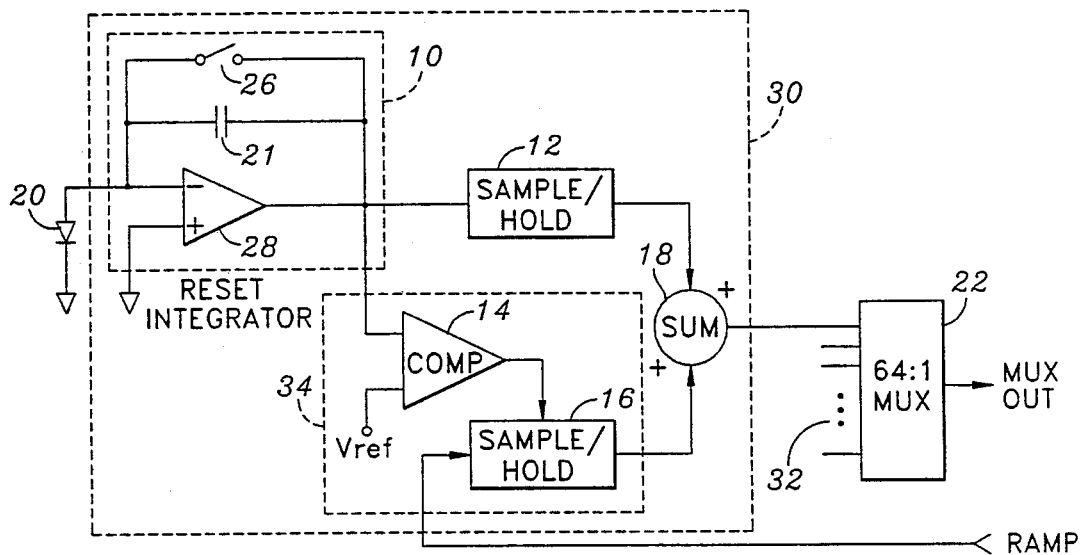
FIG. 3 is a schematic block diagram of the nonlinear transimpedance amplifier of the present invention.

Referring now to FIG. 3, a schematic block diagram of the non-linear transimpedance amplifier 30 of the present invention is depicted. The non-linear transimpedance amplifier 30 of the present invention is comprised of an accumulator or reset integrator 10 and a first sample and hold circuit 12 as in the prior art transimpedance amplifier. The non-linear transimpedance amplifier 30 further comprises a saturation sensing circuit 34 which has a comparator 14, a second sample and hold circuit 16 and a compensation circuit or summer 18.

The input to the non-linear transimpedance amplifier 30 is supplied by a photosensitive detector element 20. The output of the non-linear transimpedance amplifier 30 is typically supplied to a multiplexer 22 which can multiplex the outputs 32 of many non-linear transimpedance amplifiers 30 to an on-board data processor (not shown).

The accumulator or reset integrator 10 is comprised of a capacitor 21, a reset switch 26 and an amplifier 28. Amplifier 28 converts the low level input current from the detector element 20 into a higher level current for storage as a charge upon capacitor 21 which is connected to the output of amplifier 28. Switch 26, connected across capacitor 21, permits the resetting of capacitor 21 prior to each integration interval. This assures that substantially none of the any previously accumulated charge remains upon the capacitor 21 so that an accurate representation of the charge accumulated during a subsequent integration interval may be obtained. The reset integrator 10 accumulates a charge which is representative of that portion of the input signal which occurs prior to saturation of the capacitor 21.

The output of reset integrator 10 is connected to the comparator 14 and to sample and hold 12. Sample and hold 12 stores a voltage representative of the reset integrator 10 output as in the prior art. The comparator 14 compares the output of the reset integrator 10 to a reference voltage $V_{ref}$ and provides an output signal when the output of the reset integrator 10 is equal to the reference voltage $V_{ref}$. The amplitude of the reference voltage $V_{ref}$ is determined by the voltage at which capacitor 21 saturates.

In the preferred embodiment $V_{ref}$ is approximately equal to the voltage at which capacitor 21 of the reset integrator 10 saturates. Thus, the comparator 14 generates an output signal when capacitor 21 becomes saturated. The reference voltage $V_{ref}$ does not have to be equal to the voltage at which the charge integrator becomes saturated. It may differ from the saturation voltage by an offset. The value of the offset can be varied to compensate for inherent circuit characteristics which would otherwise cause the output of the non-linear transimpedance amplifier to vary from the theoretically achievable output. The offset can thus function as an adjustment or biasing factor.

Figure 4:
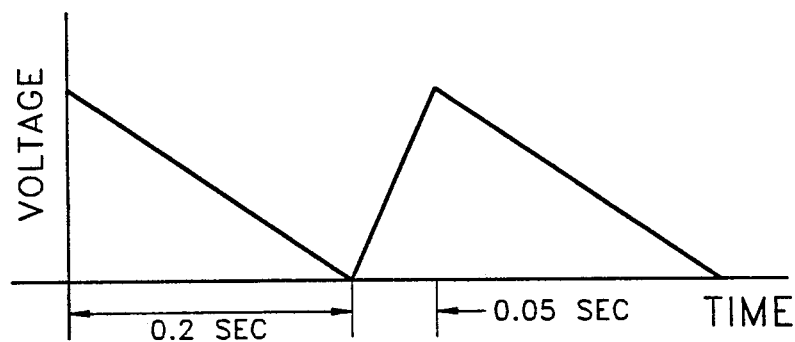
FIG. 4 is a graphical representation of the ramp provided to the saturation sensing circuit's sample and hold depicting the ramp's voltage versus time.

The sample and hold 16 receives a time varying waveform such as the linearly decreasing ramp of FIG. 4 and generates an offset or sample and hold circuit output signal. The ramp begins to decrease in amplitude at the beginning of each integration interval. The level of the ramp is captured by the saturation sensing circuit 34 sample and hold 16 when comparator 14 outputs a signal indicating that the reset integrator 10 has reached saturation. The earlier that the reset integrator 10 reaches saturation, the larger the portion of the ramp captured by the saturation sensing circuit 34 sample and hold 16. Thus, the captured portion of the ramp can be used as an offset or sample and hold output signal to compensate for the input signal lost due to saturation of the capacitor 21 in the resent integrator 10.

A compensation circuit or summer 18 adds a signal representative of the captured portion of the ramp to a signal representative of the output of the reset integrator 10. The compensation circuit or summer 18 thus provides a compensation circuit output signal which is representative of the input signal.

Referring now to FIG. 4, the ramp signal is depicted. In the preferred embodiment, the ramp signal decreases linearly in amplitude during the 200 millisecond integration interval. The ramp increases in amplitude in the 50 milliseconds prior to the beginning of the next integration interval. It is during this 50 milliseconds that capacitor 21 can be discharged through switch 26.

It is during the 200 millisecond interval that the amplitude of the ramp can be captured by the sample and hold circuit 16 of the saturation sensing circuit 34. Capturing the ramp early in the 200 millisecond interval captures a larger amplitude than capturing the ramp later in the interval. The greater the magnitude of the detector 20 output current, the sooner the ramp's amplitude is captured by the sample and hold circuit 16. Thus, the level of the ramp is representative of the magnitude of the detector 20 output current.

Figure 5:
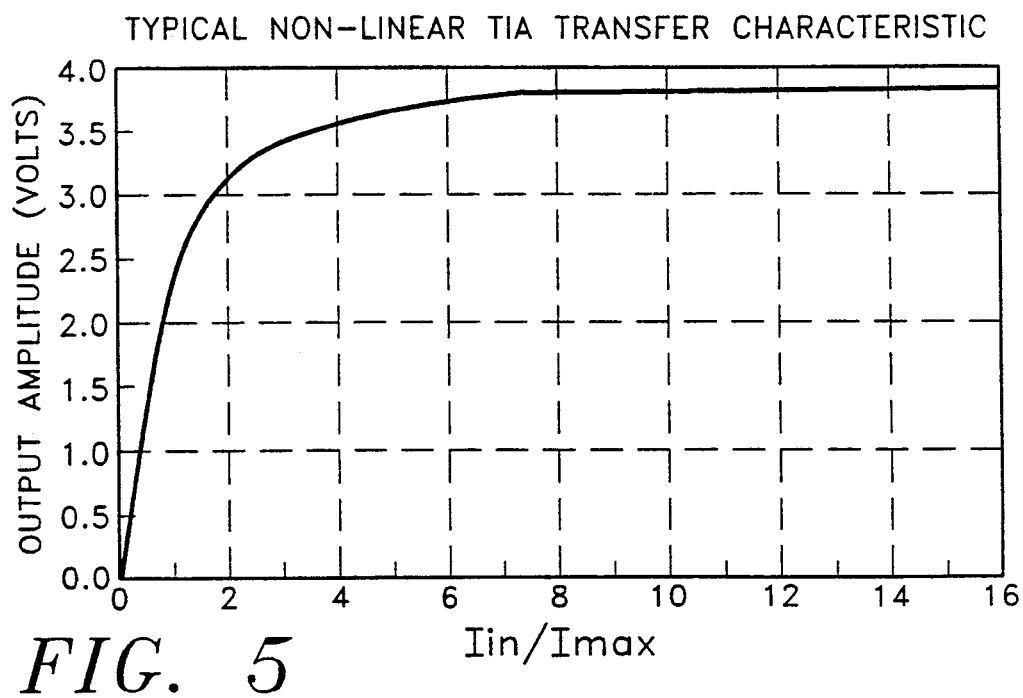
FIG. 5 is a graph depicting the output voltage of the non-linear transimpedance amplifier versus the input current level.

Referring now to FIG. 5, the output voltage of the nonlinear transimpedance amplifier of the preferred embodiment of the present invention is depicted. The function is approximately linear for input currents less than or equal to Imax (Iin/Imax=1), reflecting the inherent linearity of the reset integrator 10 prior to saturation. For input currents greater than Imax the output voltage increases asymptotically toward four volts, thus illustrating the non-linearity of the transimpedance amplifier 30 for input current levels which cause the capacitor 21 of the reset integrator 10 to saturate.

Various time varying waveforms may be utilized by the sample and hold 16 of the saturation sensing circuit 34 to provide various output functions. While the linearly decreasing ramp of FIG. 4 provides the output function of FIG. 5, a logarithmically decreasing ramp, for example, would provide a different output function.

The $V_{ref}$ and ramp signals are externally generated and may be used simultaneously by a large number of non-linear transimpedance amplifiers. The use of common $V_{ref}$ and/or ramp signals by a plurality of non-linear transimpedance amplifiers provides uniformity of performance. The use of a single $V_{ref}$ provides uniformity in the detection of saturation of the accumulator. The use of a single ramp provides uniformity in the generation of a signal from the sample and hold representative of the time at which the accumulator saturated.

Although the preferred embodiment discloses a non-linear transimpedance amplifier, the present invention is suitable for use as a linear amplifier as well. A non-linear amplifier is disclosed because non-linear amplifiers find particular application in the conditioning of signals having a broad range of input levels. This is especially true when the output of the amplifier is supplied to a device having a strictly limited dynamic range.

The transimpedance amplifier of the present invention will function as a linear amplifier if a time constant waveform is supplied to the saturation sensing circuit's 34 sample and hold 16. Indeed, the output of the saturation sensing circuit 34 need only be a signal which increases at a linear rate after the charge integrator 10 saturates in order for the transimpedance amplifier 30 to function linearly.

The use of a linear transimpedance amplifier would have the advantage of not requiring conversion of the output to a linear signal by the analog-to-digital converter or the on-board data processor. The use of the linear transimpedance amplifier has the disadvantage of reducing resolution of lower signal levels.

It is understood that the exemplary non-linear transimpedance amplifier described herein and shown in the drawings represents only a presently preferred embodiment of the invention. Indeed, various modifications and additions may be made to such embodiment without departing from the spirit and scope of the invention. For example, various means may be used to accumulate a charge and to sense saturation of the means for accumulating a charge. Also, the saturation sensing circuit may affect the output of the circuit for accumulating a charge in a manner other than by the addition of their outputs. For instance, the outputs could be multiplied. Thus, these and other modifications and additions may be obvious to those skilled in the art and may be implemented to adapt the present invention for use in a variety of different applications.

What is claimed is:

1. A transimpedance amplifier having a broad dynamic range for amplifying an input signal over an extended range of levels and for providing an output signal representative of the input signal, the amplifier utilizing an externally generated reference voltage and an externally generated time varying signal, the amplifier comprising:
   (a) an accumulator for receiving the input signal, for accumulating a charge, and for generating an accumulator output signal representative of the charge accumulated;
   (b) a saturation sensing circuit in electrical communication with said accumulator for sensing accumulator saturation and for generating a saturation sensing circuit output signal representative of the time at which said accumulator becomes saturated; and
   (c) a compensation circuit in electrical communication with said accumulator and said saturation sensing circuit for supplementing the accumulator output signal in response to the saturation sensing circuit output signal and for generating a compensation circuit output signal;
   (d) wherein the compensation circuit output signal is representative of the input signal whether or not the input signal causes saturation of the accumulator.

2. The transimpedance amplifier as recited in claim wherein said accumulator comprises a reset integrator.

3. The transimpedance amplifier as recited in claim wherein said saturation sensing circuit comprises:
   (a) a comparator in electrical communication with said accumulator for comparing the accumulator output to the reference voltage and for generating a comparator output when the accumulator output is at a predetermined potential relative to the reference voltage; and
   (b) a sample and hold circuit in electrical communication with said comparator for receiving the external time varying signal and for generating a sample and hold circuit output signal representative of the amplitude of the time varying signal when the comparator output is generated.

4. The transimpedance amplifier as recited in claim wherein said compensation circuit receives a signal representative of the accumulator output signal and a signal representative of the sample and hold circuit output signal, and generates a compensation circuit output signal representative of the sum thereof.

5. The transimpedance amplifier as recited in claim wherein the reference voltage is representative of the accumulator output signal at accumulator saturation.

6. The transimpedance amplifier as recited in claim wherein the time varying signal is characterized by a decreasing amplitude.

7. The transimpedance amplifier as recited in claim wherein the time varying signal comprises a periodic linearly decreasing ramp signal.

8. The transimpedance amplifier as recited in claim wherein said accumulator comprises a capacitor for accumulating a charge representative of the input signal.

9. The transimpedance amplifier as recited in claim wherein said accumulator further comprises a switch for periodically discharging any charge accumulated upon said capacitor.

10. The transimpedance amplifier as recited in claim 9 wherein said compensation circuit output signal is a non-linear function of the input signal.

11. A transimpedance amplifier having a broad dynamic range for amplifying an input signal over an extended range of levels utilizing an externally generated reference voltage and an externally generated time varying signal, the amplifier comprising:
  (a) an accumulator for accumulating a charge representative of the input signal, and for generating an accumulator output signal representative of the accumulated charge;
  (b) a comparator in electrical communication with said accumulator for comparing the accumulator output to the reference voltage and for generating an output when the accumulator output is at a predetermined potential relative to the reference voltage;
  (c) a sample and hold circuit in electrical communication with said comparator for receiving the time varying signal and for generating a sample and hold output signal representative of the amplitude of the time varying signal when the comparator output is generated;
  (d) a summing circuit in electrical communication with said accumulator and said sample and hold circuit for receiving a signal representative of the accumulator output signal and a signal representative of the sample and hold output signal and for generating a summing circuit output signal representative of the sum thereof;
  (e) wherein the summing circuit output signal is representative of the input signal whether or not the input signal causes saturation of said accumulator.

12. The transimpedance amplifier as recited in claim wherein the reference voltage is representative of the accumulator output signal at accumulator saturation.

13. The transimpedance amplifier as recited in claim 12 wherein the time varying signal is characterized by a decreasing amplitude.

14. The transimpedance amplifier as recited in claim 12 wherein the time varying signal comprises a periodic linearly decreasing ramp signal.

15. The transimpedance amplifier as recited in claim 12 wherein said accumulator comprises a capacitor for accumulating a charge representative of the input signal.

16. The transimpedance amplifier as recited in claim 15 wherein said accumulator further comprises a switch for periodically discharging any charge accumulated upon said capacitor.

17. The transimpedance amplifier as recited in claim 16 wherein the summing circuit output signal is a non-linear representation of the input signal.

18. A method for amplifying an input signal over an extended range of levels and for providing an output representative of the input signal, the method comprising the steps of:
  (a) receiving an input signal;
  (b) accumulating a charge within an accumulator, the charge being representative of at least a portion of the input signal;
  (c) generating an accumulator output signal representative of the accumulated charge;
  (d) sensing the time at which the accumulator becomes saturated;
  (e) generating a saturation sensing signal representative of the time at which the accumulator becomes saturated; and
  (f) supplementing the accumulator signal output with a signal representative of the time at which the accumulator becomes saturated; and
  (g) wherein the supplemented accumulator output signal is representative of the input signal when the input signal saturates said accumulator and is also representative of the input signal when the input signal does not saturate said accumulator.

19. The method as recited in claim 18 wherein the step of accumulating a charge representative of the input signal within an accumulator comprises accumulating a charge representative of the input signal within a reset integrator.

20. The method as recited in claim 19 wherein the step of sensing the time at which the accumulator becomes saturated comprises the step of comparing the accumulator output signal to a reference voltage.

21. The method as described in claim 20 wherein the step of supplementing the accumulator output signal comprises the steps of:
  (a) receiving a time varying signal and generating an offset signal representative of the amplitude of the time varying signal at a predetermined time relative to the time at which the accumulator becomes saturated; and
  (b) summing the accumulator output signal with said offset signal.

22. The method as described in claim 21 wherein the step of receiving a time varying signal comprises the step of receiving a signal having a decreasing amplitude.

23. The method as described in claim 21 wherein the step of receiving a time varying signal comprises the step of receiving a periodic linearly decreasing ramp signal.

* * * * *